United States Patent
Smith et al.

(10) Patent No.: US 10,076,020 B2
(45) Date of Patent: *Sep. 11, 2018

(54) APPARATUS AND METHOD FOR PLASMA IGNITION WITH A SELF-RESONATING DEVICE

(71) Applicant: MKS Instruments Inc., Andover, MA (US)

(72) Inventors: Shaun T. Smith, Malden, MA (US); Steven R. Walther, Andover, MA (US); Chen Wu, Foster City, CA (US)

(73) Assignee: MKS Instruments, Inc., Andover, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/643,060

(22) Filed: Jul. 6, 2017

(65) Prior Publication Data

US 2017/0303382 A1 Oct. 19, 2017

Related U.S. Application Data

(63) Continuation of application No. 14/616,089, filed on Feb. 6, 2015, now Pat. No. 9,736,920.

(51) Int. Cl.
*H05H 1/46* (2006.01)
*H01J 37/32* (2006.01)

(52) U.S. Cl.
CPC ......... *H05H 1/46* (2013.01); *H01J 37/32082* (2013.01); *H01J 37/32174* (2013.01); *H01J 37/32192* (2013.01); *H01J 37/32247* (2013.01); *H01J 37/32311* (2013.01); *H05H 2001/4607* (2013.01); *H05H 2001/4652* (2013.01)

(58) Field of Classification Search
CPC .......... H05H 1/46; H05H 1/24; H05B 41/382
USPC ................. 315/39, 111.51, 276; 324/307, 32
See application file for complete search history.

(56) References Cited

U.S. PATENT DOCUMENTS

| | | | |
|---|---|---|---|
| 4,588,490 A | 5/1986 | Cuomo et al. | |
| 5,641,359 A | 6/1997 | Yavelberg | |
| 5,689,215 A | * 11/1997 | Richardson | ....... H01J 37/32082 333/17.3 |
| 5,753,886 A | 5/1998 | Iwamura et al. | |

(Continued)

OTHER PUBLICATIONS

Baena, et al., Equivalent-Circuit Models for Split-Ring Resonators and Complementary Split-Ring Resonators Coupled to Planar Transmission Lines, IEEE Transactions on Microwave Theory and Techniques, Apr. 2005, pp. 1451-1461, vol. 53, No. 4.

(Continued)

*Primary Examiner* — Thai Pham
*Assistant Examiner* — Syed M Kaiser
(74) *Attorney, Agent, or Firm* — Proskauer Rose LLP

(57) ABSTRACT

Methods and apparatus for igniting a process plasma within a plasma chamber are provided. One or more self-resonating devices are positioned within a plasma chamber relative to a plasma generation volume within the plasma chamber. The plasma generation volume is defined by the plasma chamber. Each of the self-resonating devices generates an ignition plasma. The ignition plasmas cause a partial ionization of an ignition gas. The partially ionized ignition gas allows for ignition of a process plasma by applying an electric field to the plasma generation volume.

29 Claims, 5 Drawing Sheets

(56) References Cited

U.S. PATENT DOCUMENTS

| | | | |
|---|---|---|---|
| 5,916,455 A * | 6/1999 | Kumagai | H01J 37/321 118/723 I |
| 6,117,243 A | 9/2000 | Walther | |
| 6,225,746 B1 | 5/2001 | Wickramanayaka | |
| 6,388,226 B1 | 5/2002 | Smith et al. | |
| 6,806,652 B1 * | 10/2004 | Chistyakov | H01J 37/32009 118/723 DC |
| 7,279,429 B1 * | 10/2007 | Gabriel | C23C 16/505 216/71 |
| 8,053,372 B1 | 11/2011 | Greer et al. | |
| 8,716,939 B2 | 5/2014 | Utano et al. | |
| 9,006,972 B2 | 4/2015 | Hopwood | |
| 2002/0005169 A1 | 1/2002 | Daviet | |
| 2002/0196819 A1 * | 12/2002 | Spinelli | H01S 5/141 372/21 |
| 2005/0103623 A1 | 5/2005 | Tolmachev et al. | |
| 2005/0205211 A1 | 9/2005 | Singh et al. | |
| 2007/0103092 A1 * | 5/2007 | Millner | H01J 37/321 315/276 |
| 2007/0106349 A1 * | 5/2007 | Karni | A61B 18/042 607/101 |
| 2008/0076958 A1 * | 3/2008 | Britva | A61B 18/18 600/9 |
| 2010/0001647 A1 | 1/2010 | Krohmann et al. | |
| 2011/0234102 A1 | 9/2011 | Kim et al. | |
| 2012/0135158 A1 * | 5/2012 | Freer | B82Y 10/00 427/532 |
| 2013/0128397 A1 * | 5/2013 | Sato | H01J 37/32174 361/54 |
| 2014/0117988 A1 * | 5/2014 | Annino | G01R 33/282 324/321 |
| 2014/0327357 A1 * | 11/2014 | Smith | F02P 9/007 315/39 |
| 2015/0008917 A1 * | 1/2015 | Kentgens | G01R 33/307 324/307 |
| 2015/0155439 A1 * | 6/2015 | Cich | H01L 33/32 362/294 |
| 2015/0206711 A1 * | 7/2015 | Ozimek | H01J 37/321 315/111.51 |
| 2015/0255994 A1 * | 9/2015 | Kesler | H02J 5/005 307/10.1 |
| 2016/0022349 A1 * | 1/2016 | Woloszko | A61B 18/14 606/34 |

OTHER PUBLICATIONS

Bernard et al., Measurement of Dielectric Constant Using a Microstrip Ring Resonator, IEEE Transactions on Microwave Theory and Techniques, Mar. 1991, pp. 592-595, vol. 39, No. 3.

Iza et al., Low-Power Microwave Plasma Source Based on a Microstrip Split-Ring Resonator, IEEE Transactions on Plasma Science, Aug. 2003, pp. 782-787, vol. 31, No. 4.

Lei et al., Synergistic Behavior of a Dual Tandem Plasma Source, APS Gaseous Electronics Conference 2013, Abstract #KW1.003, Sep. 2013, 3 pages, http://adsabs.harvard.edu/abs/2013APS..GECKW1003L Jun. 23, 2015.

Liu et al., Paper PS1-FrM10, A Global Model for Ignition Delay of Pulsed Electronegative Plasmas, AVS 61st International Symposium & Exhibition Plasma Science and Technology Session PS1-FrM, Nov. 14, 2014, 2 pages, http://2.avs.org/symposium2014/Papers/Paper_PSI-FrM10 . . . Jun. 23, 2015.

Shin et al., Control of ION Energy Distributions Using a Pulsed Plasma with Synchronous Bias on a Boundary Electrode, Plasma Sources Science Technology, vol. 20, 2011, 9 pages, University of Houston, Texas.

Shyam et al., Control of Electron Energy Distribution Functions Using a Tandem Source Reactor, American Physical Society, 65th Annual Gaseous Electronics Conference, Oct. 22-26, 2012, Abstract #NW1.064, Oct. 2012, 2 pages, http://adsabs.harvard.edu/abs2012APS..GECNW1064S Jun. 23, 2015.

Sridhar et al., Paper PS1-FrM9, Ignitiion Delay in Electronegative Pulsed Dual Source Tandem Plasmas, AVS 61st International Symposium & Exhibition Plasma Sciences and Technology Session PSI1-FrM, Nov. 14, 2014, 2 pages, http://www2avs.org/symposium2014/Papers/Paper_PSI-FrM9.h . . . Jun. 23, 2015.

* cited by examiner

500

APPARATUS AND METHOD FOR PLASMA IGNITION WITH A SELF-RESONATING DEVICE

CROSS REFERENCE TO RELATED APPLICATION

This application is a continuation of U.S. Ser. No. 14/616,089, filed Feb. 6, 2015, which is owned by the assignee of the instant application and is incorporated herein by reference in its entirety.

FIELD OF THE INVENTION

This invention relates generally to the field of igniting and sustaining plasma to generate activated gas containing ions, free radicals, atoms, and molecules. In particular, self-resonating devices partially ionize a process plasma ignition gas and are positioned relative to a plasma generation volume to cause a plasma ignition gas to ignite in the presence of an electric field.

BACKGROUND OF THE INVENTION

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into a plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas.

Capacitively-coupled RF discharges and DC discharges inherently produce high energy ions and, therefore, are often used to generate plasmas for applications where the material being processed is in direct contact with the plasma. Microwave discharges produce dense, low ion energy plasmas. Microwave discharges are also useful for applications where it is desirable to generate ions at low energy and then accelerate the ions to the process surface with an applied potential.

RF inductively coupled plasmas are particularly useful for generating large area plasmas for such applications as semiconductor wafer processing. However, some RF inductively coupled plasmas are not purely inductive because the drive currents are only weakly coupled to the plasma. Consequently, RF inductively coupled plasmas are often inefficient and require the use of high voltages on the drive coils. The high voltages produce high electrostatic fields that cause high energy ion bombardment of reactor surfaces. The ion bombardment deteriorates the reactor and can contaminate the process chamber and the material being processed. The ion bombardment can also cause damage to the material being processed.

Microwave and inductively coupled plasma sources can require expensive and complex power delivery systems. These plasma sources can require precision RF or microwave power generators and complex matching networks to match the impedance of the generator to the plasma source. In addition, precision instrumentation is usually required to ascertain and control the actual power reaching the plasma.

Igniting a plasma can also require power delivery systems that are capable of providing a power large enough to cause ionization of a plasma gas. In current systems, igniting the plasma can require supplying a high electric field (e.g., breakdown field) that is sufficient to cause a gas to excite to a state where a plasma forms, which is guided by, for example, Paschen curves. For microwave plasmas, capacitively coupled plasmas, inductively coupled plasmas, and/or glow discharge plasmas, typically a high electric field (e.g., 0.1 to 10 kV/cm) is applied to a cause an initial breakdown of the gas.

Application of a high voltage to ignite a plasma can cause several difficulties, for example, arcing outside of the ignition window (e.g., the standard operating ranges for pressure, gas flow, and/or gas species for successful ignition) and/or electrical breakdown of dielectrics (e.g., punch through). Additional undesired arcing and electrical breakdown of dielectrics can cause damage to the plasma chamber and/or system parts. Damaged parts can require frequent replacement and can be expensive. Another difficulty of applying a high voltage to ignite is that typically a custom ignition design is needed for different types/shapes of plasma sources.

Current techniques for applying a high voltage to ignite a plasma include use of a high voltage spark plug or high voltage electrodes coupled to the plasma chamber. Another current technique is applying the high voltage directly to a portion of the plasma chamber itself (e.g., block ignition). In addition to the difficulties described above, each of these ignition techniques has difficulties.

Spark plugs typically have a limited lifetime due to for example, relays used in the spark plug, thus requiring frequent replacement. High voltage electrodes typically have to withstand exposure to the plasma during processing. This can cause a limited lifetime for the electrodes and/or limited material options for the electrode. Block ignition creates a potential for plasma arcing and can limit the choices for block materials/coatings.

Therefore, it is desirable to ignite a plasma without arcing, punch through, or exposing parts and/or the plasma chamber itself to high voltages, ion bombardment, radicals, and/or undesirable arcing/heat.

SUMMARY OF THE INVENTION

Advantages of the invention include minimization of arcing because high voltages are not necessary to cause plasma ignition. Other advantages of the invention include a reduction in the frequency of replacing parts due to the substantial elimination of exposure to high voltages, arcs and/or punch through.

Other advantages include a reduction of cost due to a minimization of the necessity of expensive parts and/or a custom ignition designs. Other advantages include allowing for a wider range of chamber materials/coatings because the material no longer has to withstand high voltages, arcing, and/or punch through.

Other advantages include using the plasma source as a starter plasma for other plasma sources that operate in previously inaccessible pressure and/or flow regimes due to the elimination of the requirement for a high ignition voltage. Other advantages include the ability to perform high rate pulsed plasma processing in processing chambers where impedance conditions for initial breakdown and processing conditions are vastly different due to the ability to ignite with the process gas and avoid switching from an inert gas mixture which is typically currently needed.

Other advantages include a reduction of a tuning range requirement for inductively coupled plasma due to a reduction in the electric field needed for ignition. Other advantages include simplified electronics due to the use of a self-resonating device, and/or elimination of an otherwise needed ignition switching scheme.

In one aspect, the invention involves a method for igniting a process plasma. The method involves flowing an ignition gas into a plasma chamber. The method also involves using at least one self-resonating device to form at least one ignition plasma within the plasma chamber, the at least one ignition plasma causing at least partial ionization of the ignition gas. The method also involves igniting the process plasma within the plasma chamber by inductively coupling power to the plasma chamber.

In some embodiments, the self-resonating device resonates with a radio frequency or microwave frequency. In some embodiments, the method involves positioning the at least one self-resonating device adjacent to a plasma generation volume within the plasma chamber, the plasma generation volume being a region within which the process plasma forms.

In some embodiments, the method involves positioning a first self-resonating device of the at least one self-resonating device at an inlet of the plasma chamber and a second self-resonating device at an outlet of the plasma chamber. In some embodiments, the method involves positioning a first self-resonating device of the at least one self-resonating device and a second self-resonating device at an equidistance along the plasma channel.

In some embodiments, the method involves operating the at least one self-resonating device at a frequency between 100 megahertz and 10 gigahertz. In some embodiments, the method involves operating the at least self-resonating device at a frequency between 300 megahertz and 3 gigahertz.

In some embodiments, the at least one self-resonating device is a coaxial resonator, ring resonator, split-ring resonator, half-wave resonator, annular single split ring resonator, annular split ring resonator, stripline split ring resonator, half-wave resonator with two discharge gaps, a split ring resonator loaded half wave resonator, a split ring resonator loaded transmission, or any combination thereof. In some embodiments, the at least one self-resonating device is a microstrip resonator, stripline resonator, or any combination thereof. In some embodiments, the process plasma is ignited with an average field of approximately 1 to 10 kilovolts per meter.

In some embodiments, the ignition plasma is sustained with a voltage less than 100 Vrms. In some embodiments, a peak voltage of the ignition plasma is less than 300 Vrms. In some embodiments, the method involves supplying the at least one self-resonating device a power less than 50 Watts. In some embodiments, a pressure within the plasma chamber is less than 50 torr.

In one aspect, the invention includes a plasma source for generating a plasma. The plasma source includes a plasma ignition gas source that flows a plasma ignition gas into a plasma chamber. The plasma source also includes at least one self-resonating device that generates at least one ignition plasma within the plasma chamber, the at least one ignition plasma causing at least partial ionization of the plasma ignition gas. The plasma source also includes a power source in direct electrical communication with the plasma chamber to ignite the process plasma within the plasma chamber.

In some embodiments, the plasma source includes positioning the at least one self-resonating device adjacent to a plasma generation volume inside the plasma chamber, the plasma generation volume being a region within which the process plasma forms.

In some embodiments, a first self-resonating device of the at least one self-resonating device and a second self-resonating device are positioned an equidistance along the plasma generation volume. In some embodiments, a first self-resonating device of the at least one self-resonating device is positioned at an inlet of the plasma chamber and a second self-resonating device is positioned at an outlet of the plasma chamber.

In some embodiments, the at least one self-resonating device operates at a microwave frequency or a radio frequency. In some embodiments, the at least one self-resonating device operates at a frequency between 100 megahertz and 10 gigahertz. In some embodiments, the at least one self-resonating device operates at a frequency between 300 megahertz and 3 gigahertz.

In some embodiments, the at least one self-resonating device is a coaxial resonator, ring resonator, or any combination thereof. In some embodiments, the process plasma is ignited with an average field of 10 kilovolts per meter. In some embodiments, the one or more ignition plasmas is sustained with a voltage less than 100 Vrms.

In some embodiments, a peak voltage of the ignition plasma is less than 300 Vrms. In some embodiments, the at least one self-resonating device is supplied a power less than 10 Watts. In some embodiments, a pressure within the plasma chamber is less than 50 torr.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

In general, one or more self-resonating devices are positioned relative to a plasma generation volume that is defined by a plasma chamber. During ignition, each self-resonating device creates its own plasma (e.g., ignition plasma) that at least partially ionizes a gas (e.g., ignition gas) that flows into the plasma generation volume. Energy is coupled into the plasma generation volume and a plasma (e.g., process plasma) ignites.

The partial ionization of the ignition gas allows for ignition of the process plasma to occur with less energy than is required to cause ignition of the process plasma without the partial ionization (e.g., without the one or more self-resonating devices.)

Figure 1:
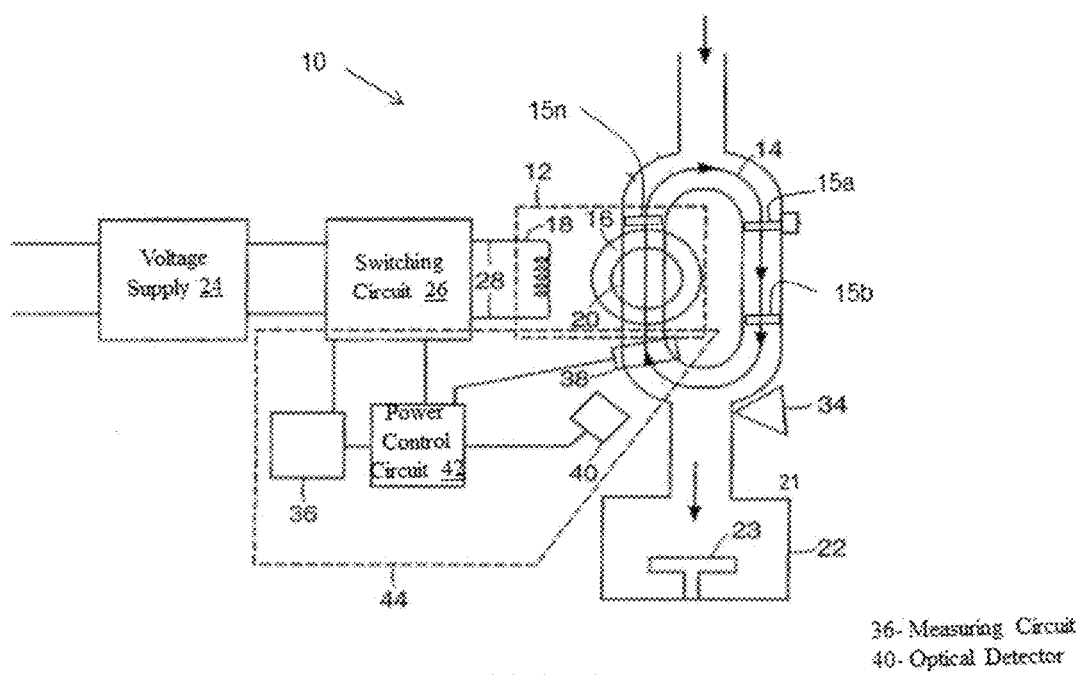
FIG. 1 is a schematic representation of a plasma source for producing activated gases, according to an illustrative embodiment of the invention.

FIG. 1 is a schematic representation of a plasma source 10 for producing activated gases, according to an illustrative embodiment of the invention. The plasma source 10 provides activated gases to a semiconductor process chamber 22. The plasma source 10 includes a power transformer, a plasma chamber 20, a gas inlet 32, a first self-resonating device 15*a*, a second self-resonating device 15*b*, a third self-resonating device, 15*n*, generally, self-resonating devices 15, a switching power supply (voltage supply 24 and switching element 26), and a feedback loop 44.

The power transformer includes a magnetic core 16, a primary coil 18, and a process plasma 14 (once ignited). The power transformer couples power received from the switching power supply into a plasma generation volume. The plasma generation volume is defined by the plasma chamber 20. The power transformer also couples power received from the switching power supply into three ignition plasma volumes, one ignition plasma volume for each of the self-resonating devices 15. The magnetic core 16 wraps around the plasma chamber 20 such that the plasma chamber 20 passes through the magnetic core 16. The primary coil 18 and magnetic core 16 allow the process plasma 14 that is ignited and sustained within the plasma generation volume to form a secondary circuit of the power transformer.

In various embodiments, the power transformer includes two, four or any number of magnetic cores. In various embodiments, the plasma chamber 20 can be made of a dielectric material, such as quartz, alumina or sapphire, or a metal such as aluminum, or a coated metal such as anodized aluminum.

In some embodiments, each of the self-resonating devices 15 has its own respective powers supply. For example, each respective power supply can be a microwave amplifier providing power of approximately 3 Watts of power. In some embodiments, each respective power supply is a voltage controlled oscillator that allows the microwave frequency to be controlled. In some embodiments, each respective power supply is on a microchip with its respective self-resonating device. In these embodiments, the microchip be supplied power by a low voltage DC power supply. In some embodiments, each respectively power supply is housed separately from its respective self-resonating device.

In some embodiments, the switching power supply can be a solid state switching supply, as described in, for example, FIG. 7 and FIG. 8 of U.S. Pat. No. 6,388,226, which is incorporated herein by reference in its entirety.

The self-resonating devices 15 are coupled to the plasma chamber 20. During operation, an ignition gas is flowed into the plasma chamber 20. Each of the self-resonating devices 15 generates an ignition plasma within its corresponding ignition plasma volume, all within the plasma chamber 20. The ignition plasma generated by the self-resonating devices at least partially ionizes the ignition gas.

The partially ionized gas created by self-resonating devices 15 allow for breakdown of the gas used to ignite the process plasma (e.g., the same ignition gas as is used to generate the ignition plasma and/or additional gases) with applied electric field intensities for which breakdown without the self-resonating devices is not possible (e.g., intensity that is less than what is expected from Paschen curves). In this manner, the electric field required to ignite the process plasma (e.g., approximately 50 volts/meter) is less than the electric field required to ignite the process plasma without the self-resonating devices 15 in the plasma chamber (e.g., greater than 300 volts/meter).

In some embodiments, the power required to generate each plasma of the self-resonating devices is less than 10 Watts per self-resonating device. In this manner, the power required to cause ignition of the process plasma (e.g., 10 Watts per self-resonating device) is less than the power required to cause ignition of the process plasma (e.g., approximately 100 to 300 Watts) without the self-resonating devices 15.

With partially ionized ignition gas created by the self-resonating devices 15 and ignition gas within the plasma generation volume, when the power transformer couples power into the plasma generation volume, the process plasma 14 ignites. In this manner, the process plasma ignites without the use of an ignition electrode and/or a high voltage applied to the plasma chamber 20. Once ignition of the process plasma 14 occurs, the self-resonating devices 15 stop generating the ignition plasma.

Each of the self-resonating devices 15 can generate a plasma that has a smaller density than the density of the process plasma and/or exists in a smaller volume than the volume of that the process plasma exists within. Thus the power required to supply to the self-resonating devices 15 (e.g., power for plasma ignition) can be less than the power required to sustain the process plasma.

Gases exit the plasma chamber 20 and enter the process chamber 22 via an outlet of the plasma chamber 20. In some embodiments, the plasma chamber 20 includes multiple gas inlets. In various embodiments, the plasma chamber 20 has one gas outlet for each magnetic core. In various embodiments, the plasma chamber 20 includes more gas outlets than magnetic cores.

In some embodiments, the ignition gas and a gas used while the plasma 14 is sustained (e.g., process plasma gas) are the same. In some embodiments, the process gas is NH3, O2, H2, N2, NF3, or any combination thereof. In some embodiments, the ignition gas and the process plasma gas are different. In various embodiments, the ignition gas is Helium, Argon, Krypton, Xenon, Neon, Radon, Ununoctium, Hydrogen, Nitrogen or any combination thereof. It is apparent to one of ordinary skill, the ignition gas can be any gas capable of igniting into plasma.

A sample holder 23 can be positioned in the process chamber 22 to support the material to be processed. The material to be processed can be biased relative to the potential of the plasma. In some embodiments, a showerhead (not shown) is located between the plasma chamber outlets 50 and the sample holder 23, such that the activated gas is distributed substantially uniformly over the surface of the material to be processed.

The plasma source 10 can also include a measuring circuit 36 for measuring electrical parameters of the primary winding 18. Electrical parameters of the primary winding 18 include the current driving the primary winding 18, the voltage across the primary winding 18, the bus or line voltage that is generated by the voltage supply 24, the average power in the primary winding 18, and the peak power in the primary winding 18. The electric parameters of the primary winding can be continuously monitored.

The power delivered to the plasma can be accurately controlled by a feedback loop 44 that comprises the power control circuit 42, the measuring circuit 36 for measuring electrical parameters of the primary winding 18 and the switching circuit 26 containing one or more switching semiconductor devices. In addition, the feedback loop 44 can include a voltage probe and a current probe.

The plasma source 10 can also include a measuring circuit 36 for measuring electrical parameters of the primary winding 18. Electrical parameters of the primary winding 18 include the current driving the primary winding 18, the voltage across the primary winding 18, the bus or line voltage that is generated by the voltage supply 24, the average power in the primary winding 18, and the peak power in the primary winding 18. The electric parameters of the primary winding can be continuously monitored.

The power delivered to the plasma can be accurately controlled by monitoring power measurements that are based on a DC bus that feeds an RF section.

The plasma source 10 is useful for processing numerous materials, such as solid surfaces, powders, and gases. The plasma source 10 is particularly useful for providing activated gases in semiconductor processing equipment, such as thin film deposition and etching systems. The plasma source 10 is also particularly useful for photoresist stripping, atomic layer deposition, wafer cleaning, and gate oxide, process chamber cleaning or dielectric modification.

The plasma source can be used to etch numerous materials, such as silicon, silicon dioxide, silicon nitride, aluminum, molybdenum, tungsten and organic materials like photoresists, polyimides and other polymeric materials. The plasma source 10 can be used for plasma enhanced deposition of numerous thin films materials, such as diamond films, silicon dioxide, silicon nitride, and aluminum nitride.

In addition, the plasma source 10 can be used to generate reactive gases, such as atomic fluorine, atomic chlorine, atomic hydrogen, atomic bromine, atomic nitrogen, and atomic oxygen. The plasma source can be used to generate molecular radicals, such as NH, NF, OH and other molecular fragments of stable precursors. Such reactive gases are useful for reducing, converting, stabilizing or passivating various oxides, such as silicon dioxide, tin oxide, zinc oxide and indium-tin oxide. Specific applications include flux-less soldering, removal of silicon dioxide from a silicon surface, passivation of silicon surfaces prior to wafer processing, and surface cleaning of various metal and dielectric materials such as copper, silicon, and silicon oxides.

Other applications of the plasma source 10 include modification of surface properties of polymers, metals, ceramics and papers. In addition, the plasma source 10 may be used to generate high fluxes of atomic oxygen, atomic chlorine, or atomic fluorine for sterilization.

In various embodiments, the surface material of the plasma chamber is selected based on applications and/or gas chemistries to be used during a particular process. For example, quartz is relatively stable to oxygen and chlorine plasmas, but it can be etched in fluorine and hydrogen plasmas. For generating plasmas containing fluorine, the surface of the plasma chamber can be made of aluminum, magnesium, yttrium, or their compounds because these elements can have stable fluorides.

In various embodiments, the composition of the process gases can be tailored to minimize erosion of the plasma chamber surface. For example, surfaces containing aluminum oxide, such as sapphire, alumina, or anodized aluminum, can be eroded by a hydrogen plasma. Hydrogen ions first reduce aluminum oxide and subsequently convert it to volatile aluminum hydride. Addition of a small amount of oxygen in hydrogen, in the form of $O_2$ or $H_2O$ and in the range of 1-1000 ppm, can stabilize the aluminum oxide surface and substantially reduce its erosion The plasma current and plasma current density of the plasma 14 generated by the plasma source 10 can be selected to optimize dissociation of particular gases for particular applications. For example, the plasma current and plasma current density can be selected to optimize NF3 dissociation. NF3 is widely used as a source of fluorine for chamber cleaning and numerous other applications. NF3 is relatively expensive. Optimizing the plasma source 10 for high NF3 dissociation rates improves the gas utilization rate and reduces the overall cost of operating the system. In addition, increasing the dissociation rate of NF3 is desirable because it reduces the release of environmentally hazardous gases into the atmosphere.

The dissociation of NF3 is caused by collisions between the NF3 molecules and the electrons and hot gases in the plasma. The density of electrons in the plasma source is approximately proportional to the plasma current density. There exists an optimal range of plasma current densities that maximize the dissociating of NF3 molecules. In one embodiment, a toroidal plasma 14 having a length of approximately 40-60 cm, the optimal plasma current density for efficiently dissociating NF3 gas is between 5-20 A/cm$^2$. In one embodiment, a toroidal plasma 14 having a cross sectional area of 3-10 cm$^2$, this current density range corresponds to a total toroidal plasma current in the range of approximately 20-200 A.

The materials used in the internal surface of the plasma chamber 20 and the elements that connect the output of the plasma chamber 20 to the process chamber 22 can be carefully chosen, especially if the plasma source will be used to generate chemically reactive species. Materials can be selected to meet several requirements. One requirement of the materials is that the creation of contamination that results from corrosion or deterioration of the material caused by interaction of the materials with the process gases should be minimized. Another requirement of the materials is that they have minimal erosion when exposed to process gases. Another requirement of the materials is that they should minimize recombination and deactivation of the reactive gas, thus maximizing reactant delivery to the process chamber.

Anodized aluminum has some advantages for semiconductor processing applications. One advantage is that anodized aluminum can be grown directly on an underlying aluminum base through an electrolytic process. The resulting film has excellent adherence properties. Another advantage is that anodized aluminum has a thermal conductivity that is approximately 15 times greater than the thermal conductivity of quartz. Therefore, the inside surface of plasma chambers that are formed with anodized aluminum will remain relatively cool, even with significant incident power density.

Another advantage is that anodized aluminum is chemically inert to many atomic species (F, O, Cl, etc.) as long as there is no or only low-energy ion bombardment present. Anodized aluminum is particularly advantageous for fluorine chemistries because it has a low recombination coefficient for atomic fluorine. Also, anodized aluminum is a material that is commonly used and accepted for semiconductor materials processing applications.

Quartz also has some advantages for semiconductor processing applications. Quartz is available in extremely high purity and is commonly used and accepted in the semiconductor industry. Also, quartz is stable with numerous reactive species including O, H, N, Cl, and Br. In particular, quartz has a low surface recombination coefficient for atomic oxygen and hydrogen. Also, quartz has a low thermal coefficient of expansion and has relatively high resistance to thermal shock. In addition, quartz has a high softening and melting point and, therefore, it is relatively easy to form a process chamber from quartz.

Fluoropolymers also have some advantages for semiconductor processing applications. Examples of some fluoropolymers are PTFE, PFE, PFA, FEP, and Teflon™. The recombination rate for many fluoropolymers is relatively low. Fluoropolymers also are relatively inert to most atomic species including atomic fluorine and atomic oxygen. In addition, the purity of fluoropolymers is relatively high and fluoropolymers are available in both bulk form (tube, sheet, etc.) and in thin film form.

In some embodiments, fluoropolymers, however, can be eroded by ions in the plasma. Also, the maximum operating temperature that fluoropolymers can tolerate is significantly less than the maximum temperature that quartz can tolerate. In addition, the thermal conductivity of fluoropolymers is relatively low. Therefore, in some embodiments, fluoropolymers are most useful for constructing the transport sections outside of the plasma chamber.

It is apparent to one of ordinary skill that the plasma source shown above in FIG. 1 is one exemplary configuration for a plasma source for which a process plasma can be ignited and sustained inside of a plasma generation volume and that many possible configurations for a plasma source are possible and applicable to the invention. In various embodiments, other plasma source configurations known in the art are modified to allow for self-resonating devices excite gases within plasma generation volume to allow for a process plasma to ignite with field intensities that are lower than field intensities required for a neutral ignition gas.

Figure 2:
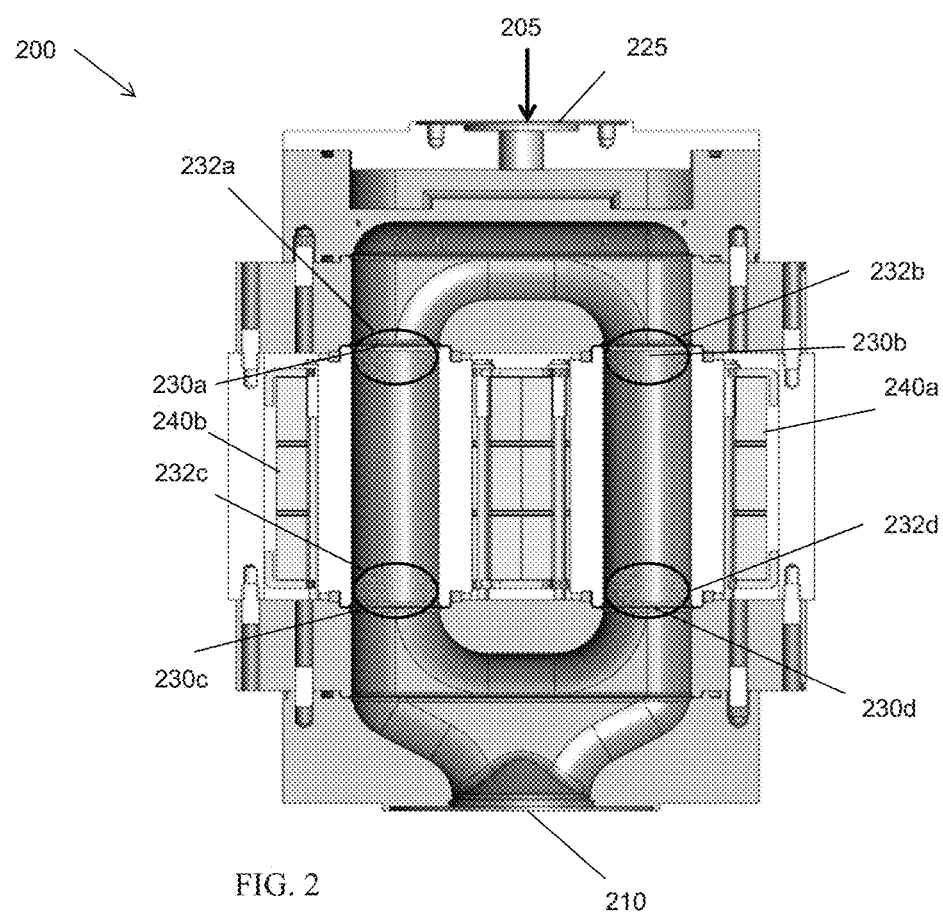
FIG. 2 is a schematic representation of a plasma chamber, according to an illustrative embodiment of the invention.

FIG. 2 is a schematic representation of a plasma chamber 200, according to an illustrative embodiment of the invention. The plasma chamber 200 is a toroidal shape and includes a plasma generation volume that is defined by the plasma chamber. The plasma chamber 200 also includes four self-resonating devices, 230a, 230b, 230c, and 230d, generally self-resonating devices 230, an inlet 205 and an outlet 210. The plasma chamber 200 is surrounded by magnetic cores 240a and 240b.

In various embodiments, each of the one or more of the self-resonating devices 230 are a coaxial resonator, ring resonator, or any combination thereof. In various embodiments, each of the one or more of the self-resonating devices 230 are a microstrip resonator, stripline resonator, or any combination thereof. In some embodiments, each of the one or more self-resonating devices are self-resonating devices are known in the art. For example, self-resonating devices as described in Chapter 6 of the book, "Microwave Engineering," by David M. Pozar, Wileys & Sons (2011), which is incorporated herein by reference.

In various embodiments, there are more or less self-resonating devices 230. In various embodiments, there are one, two, three, five, six or any number of self-resonating devices. In various embodiments, the number of self-resonating devices depends on a size of the plasma chamber 200, desired range of ignition parameters (e.g., species mix, gas pressure, and/or gas flow rate). In some embodiments, the number of self-resonating devices depends on a desired tolerance for contaminants in the gas flow or on the surface of the plasma chamber. For example, a higher number of self-resonating devices can allow for a greater tolerance for contaminants.

In some embodiments, there is one self-resonating device at the inlet 225 of the plasma chamber 200 and one self-resonating device at the outlet of the plasma chamber 200. In some embodiments, the self-resonating devices 230 are positioned at equidistance along the plasma channel. In some embodiments, each self-resonating device 230 is positioned adjacent to the plasma generation volume.

In some embodiments, the self-resonating devices 230 resonate with a microwave frequency. In some embodiments, the self-resonating devices 230 resonate with a radio frequency. In some embodiments, the self-resonating devices 230 resonate at a frequency between 100 megahertz and 10 gigahertz. In some embodiments, the self-resonating devices 230 resonate at a frequency between 300 megahertz and 3 gigahertz.

The self-resonating devices 230 can each generate a plasma (e.g., an ignition plasma) sufficient to cause partial ionization of a gas. The plasma used to generate the partial ionization of the gas can have a smaller density then the density of the process plasma. Thus, the power required to generate the partial ionization of the gas can be less than the power required to sustain the process plasma. For example, to partially ionize the gas, the power required can be a few Watts to 10 Watts, while the power to sustain the plasma can be greater than 1 kilowatt.

In some embodiments, the plasma chamber 200 includes one or more additional gas inlets to provide gas to the self-resonating devices 230. For example, for each self-resonating device 230, the plasma chamber 200 can include a corresponding gas inlet to inject gas at location near each of the self-resonating devices 230. In this manner, each of the self-resonating devices 230 can have its own gas source for ignition of its corresponding plasma.

In some embodiments, the gas used by each of the self-resonating devices 230 to ignite plasma is a different type of gas than the ignition gas used to ignite the process plasma. For example, the ignition gas can be argon, helium, or any combination thereof. In these embodiments, once each self-resonating devices 230 ignites a plasma, the ignition gas is flowed into the plasma chamber 200 such that the plasma of each of the self-resonating devices 230 can at least partially ionize the ignition gas.

In FIG. 2, during operation, an ignition gas is flowed through the inlet 225 of the plasma chamber 200. The ignition gas flows through the plasma chamber 200 and each of the self-resonating devices 230 ignite its own ignition plasma. Each ignition plasma causes the ignition gas to at least partially ionize. The partial ionization of the ignition gas can be found within the plasma chamber 200 within ionization regions 232 located near each of the self-resonating devices 230. For example, self-resonating device 230a has the corresponding ionization region 232a, self-resonating device 230b has the corresponding ionization region 232b, self-resonating device 230c has the corresponding ionization region 232c, and self-resonating device 230d has the corresponding ionization region 232d.

At least a portion of the partially ionized gas generated in each of the ionization regions flows into the plasma generation volume. An electric field is applied to the plasma generation volume via the magnetic cores 240a and 240b and the process plasma ignites within the plasma generation volume.

In various embodiments, the plasma chamber 200 is part of an inductively coupled plasma source, a capacitively coupled plasma source, a hollow cathode, a microwave discharge plasma source, or a glow discharge plasma source.

Figure 3:
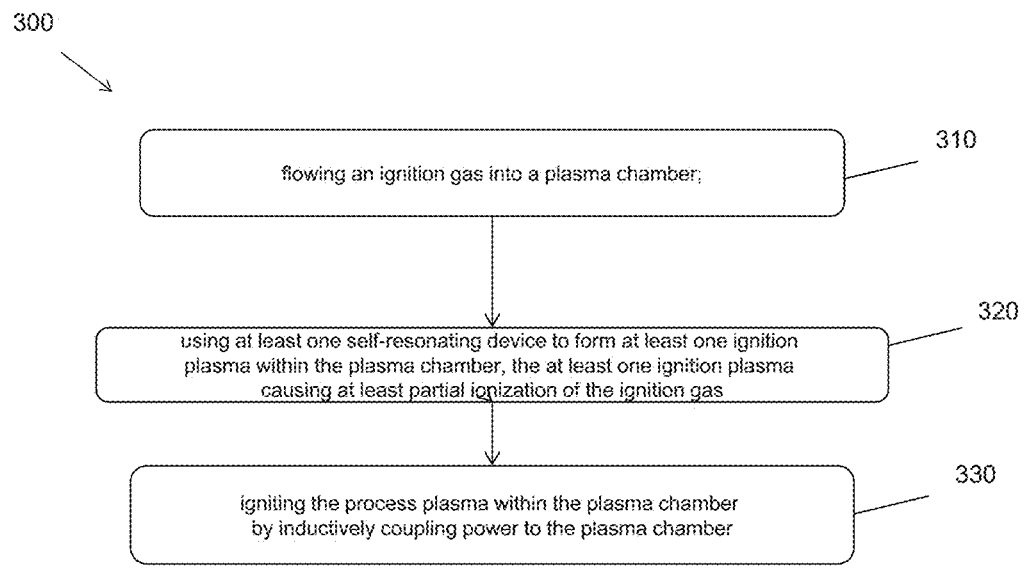
FIG. 3 is a flow diagram of a method for igniting a plasma, according to an illustrative embodiment of the invention.

FIG. 3 is a flow diagram 300 of a method for igniting a process plasma within a plasma chamber (e.g., plasma chamber 200 as shown above in FIG. 2).

The method involves flowing an ignition gas into a plasma chamber (Step 310). The method also involves using at least one self-resonating device (e.g., self-resonating devices 230, as described above in FIG. 2). Each self-resonating device forms at least one corresponding ignition plasma within the plasma chamber (Step 320). Each ignition plasma causes at least partial ionization of the ignition gas. By partially ionizing the ignition gas, when power is directly coupled into the plasma chamber, a process plasma can ignite. The process plasma can ignite by applying power (e.g., less than 10 Watts) that is less than the power required to ignite the process plasma without the partially ionized gas (e.g., 1 kilowatt).

The method also involves igniting the process plasma within the plasma chamber by inductively coupling power to the plasma chamber (Step 330).

In some embodiments, a percentage of the gas that is partially ionized is based on a predetermined ignition voltage. For example, when a higher degree of ignition ionization is achieved, by the self-resonating devices, the power required to ignite the process plasma can be reduced.

Figure 4:
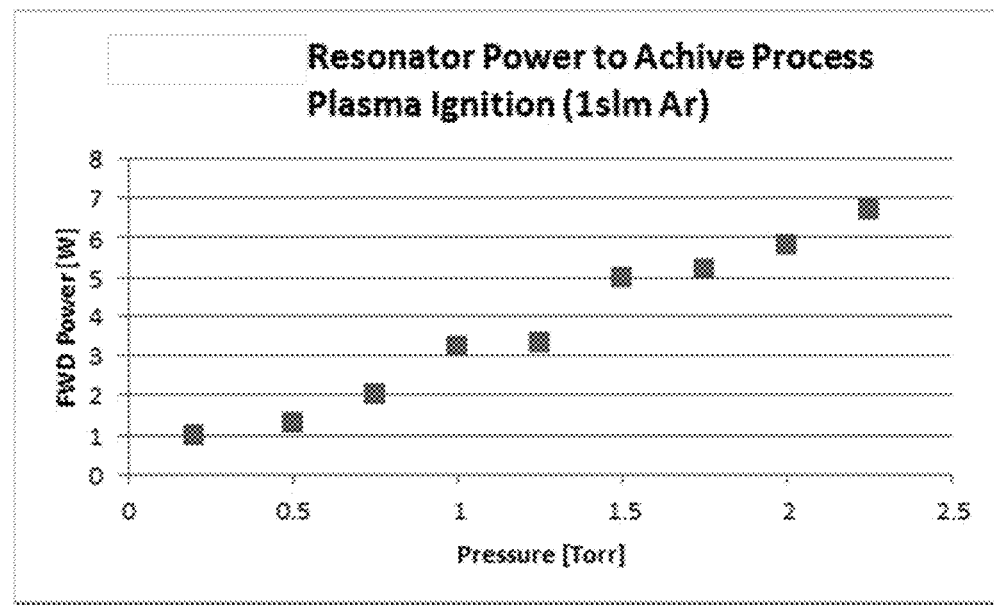
FIG. 4 is a graph of ignition power versus pressure, according to illustrative embodiment of the invention.

FIG. 4 is a graph 400 of ignition power versus plasma chamber pressure, according to illustrative embodiment of the invention. For a plasma chamber including self-resonating devices (e.g., plasma chamber 200, as shown above in FIG. 2), the power required to ignite a process plasma has a range of ~1-7 Watts for plasma chamber pressures between ~0.25 and 2.25 Torr.

Figure 5:
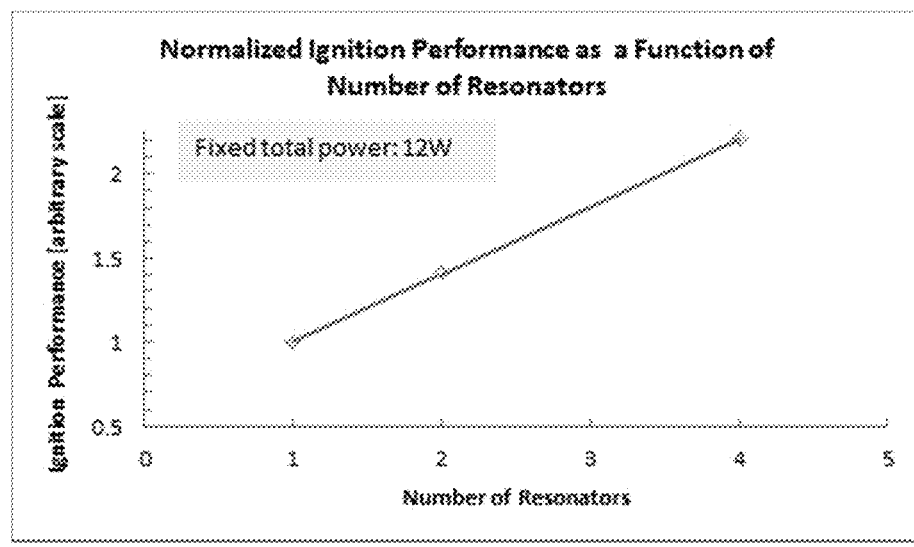
FIG. 5 is a graph of number of self-resonating devices versus ignition performance, according to illustrative embodiments of the invention.

FIG. 5 is a graph 500 of number of self-resonating devices versus ignition performance, according to illustrative embodiments of the invention. For an applied power of 12 W, a plasma chamber including four self-resonating devices (e.g., plasma chamber 200, as shown above in FIG. 2) has a higher ignition performance than a plasma chamber including three self-resonating devices.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A method for igniting a process plasma, the method comprising:
   flowing an ignition gas into a plasma chamber;
   providing at least one self-resonating device disposed relative to the plasma chamber and a power transformer coupled to the plasma chamber;
   using the at least one self-resonating device to form at least one ignition plasma within the plasma chamber, the at least one ignition plasma causing at least partial ionization of the ignition gas; and
   using the power transformer to inductively couple power to the plasma chamber, including to the at least one ignition plasma in the plasma chamber, and ignite the process plasma within the plasma chamber,
   wherein the at least one self-resonating device enables the at least partial ionization of the ignition gas using reduced power during ignition of the process plasma.

2. The method of claim 1 wherein the self-resonating device resonates with a radio frequency or microwave frequency.

3. The method of claim 1 further comprising positioning the at least one self-resonating device adjacent to a plasma generation volume, the plasma generation volume being a region within which the process plasma forms.

4. The method of claim 3 further comprising positioning a first self-resonating device of the at least one self-resonating device at an inlet of the plasma chamber and a second self-resonating device at an outlet of the plasma chamber.

5. The method of claim 3 further comprising positioning a first self-resonating device of the at least one self-resonating device and a second self-resonating device at an equidistance along the plasma channel.

6. The method of claim 1 further comprising operating the at least one self-resonating device at a frequency between 100 megahertz and 10 gigahertz.

7. The method of claim 1 further comprising operating the at least self-resonating device at a frequency between 300 megahertz and 3 gigahertz.

8. The method of claim 1 wherein the at least one self-resonating device is a coaxial resonator, ring resonator, or any combination thereof.

9. The method of claim 1 wherein the at least one self-resonating device is a microstrip resonator, stripline resonator, or any combination thereof.

10. The method of claim 1 wherein the process plasma is ignited with an average field between approximately 1 to 10 kilovolts per meter.

11. The method of claim 1 wherein the ignition plasma is sustained with a voltage less than 100 Vrms.

12. The method of claim 1 wherein a peak voltage of the ignition plasma is less than 300 Vrms.

13. The method of claim 1 further comprising supplying the at least one self-resonating device a power less than 50 Watts.

14. The method of claim 1 wherein a pressure within the plasma chamber is less than 50 torr.

15. The method of claim 1, further comprising positioning the at least one self-resonating device in or adjacent to the plasma chamber.

16. A plasma source for generating a plasma, the plasma source comprising:
   a plasma ignition gas source that flows a plasma ignition gas into a plasma chamber;
   at least one self-resonating device disposed relative to the plasma chamber, the at least one self-resonating device generates at least one ignition plasma within the plasma chamber, the at least one ignition plasma causing at least partial ionization of the plasma ignition gas;
   a power source in direct electrical communication with the plasma chamber; and
   a power transformer coupled to the plasma chamber configured to ignite the process plasma within the plasma chamber by coupling power from the power source to the plasma chamber, including to the at least one ignition plasma in the plasma chamber,
   wherein the at least one self-resonating device enables the at least partial ionization of the plasma ignition gas using reduced power during ignition of the process plasma.

17. The plasma source of claim 16 wherein the at least one self-resonating device is positioned adjacent to a plasma generation volume, the plasma generation volume being a region within which the process plasma forms.

18. The plasma source of claim 17 wherein a first self-resonating device of the at least one self-resonating device and a second self-resonating device are positioned an equidistance along the plasma generation volume.

19. The plasma source of claim 17 wherein a first self-resonating device of the at least one self-resonating device is positioned at an inlet of the plasma chamber and a second self-resonating device is positioned at an outlet of the plasma chamber.

20. The plasma source of claim 16 wherein the at least one self-resonating device operates at a microwave frequency or a radio frequency.

21. The plasma source of claim 16 wherein the at least one self-resonating device operates at a frequency between 100 megahertz and 10 gigahertz.

22. The plasma source of claim 16 wherein the at least one self-resonating device operates at a frequency between 300 megahertz and 3 gigahertz.

23. The plasma source of claim 16 wherein the at least one self-resonating device is a coaxial resonator, ring resonator, or any combination thereof.

24. The plasma source of claim 16 wherein the process plasma is ignited with an average field of 10 kilovolts per meter.

25. The plasma source of claim 16 wherein the one or more ignition plasmas is sustained with a voltage less than 100 Vrms.

26. The plasma source of claim 16 wherein a peak voltage of the ignition plasma is less than 300 Vrms.

27. The plasma source of claim 17 wherein the at least one self-resonating device is supplied a power less than 50 Watts.

28. The plasma source of claim 17 wherein a pressure within the plasma chamber is less than 50 torr.

29. The plasma source of claim 16 wherein the at least one self-resonating device is disposed in or adjacent to the plasma chamber.

* * * * *